United States Patent

Imai et al.

[11] Patent Number: 5,721,453
[45] Date of Patent: Feb. 24, 1998

[54] INTEGRATED CIRCUIT PACKAGE

[75] Inventors: Ryuji Imai; Rokuro Kanbe, both of Aichi, Japan

[73] Assignee: NGK Spark Plug Co., Ltd., Aichi, Japan

[21] Appl. No.: 895,990

[22] Filed: Jun. 8, 1992

[30] Foreign Application Priority Data

Jun. 10, 1991 [JP] Japan .................................. 3-137734

[51] Int. Cl.⁶ ..................... H01L 23/053; H01L 23/12
[52] U.S. Cl. ..................... 257/700; 257/774; 257/687; 257/798
[58] Field of Search ..................... 257/700, 678, 257/687, 698, 758, 774, 798

[56] References Cited

U.S. PATENT DOCUMENTS 4,667,219   5/1987   Lee et al. .................................. 257/700

Primary Examiner—Carl W. Whitehead
Attorney, Agent, or Firm—Finnegan, Henderson, Farabow, Garrett & Dunner, L.L.P.

[57] ABSTRACT

An integrated circuit package comprises a power supply conductor film having a potential and conductor columns insulated from and passed through the power supply conductor film. A power supply conductor column comprises one of the conductor columns connected to a power supply having a potential different from the power supply conductor film. The other conductor columns are signal conductor columns for exchanging signals with mounted integrated circuits. An insulation space between the power supply conductor film and the power supply conductor column is greater than an insulation space between the power supply conductor film and a signal conductor column. Thereby, a probability of short-circuit occurrence in the power supply conductor film across the power supply conductor column is lowered.

3 Claims, 2 Drawing Sheets

INTEGRATED CIRCUIT PACKAGE

BACKGROUND OF THE INVENTION

The present invention relates to an integrated circuit package provided with a multilayer wiring portion having a plurality of laminated wiring layers including insulation films of such as polyimide having a low dielectric constant and conductor films.

Referring to FIGS. 3 and 4, the prior art will be described. In a conventional integrated circuit package 101 provided with a multilayer wiring portion 103 having a plurality of laminated wiring layers including insulation films 106 having a low dielectric constant and conductor films 105, one mesh-like conductor film 105a is connected to one of a power supply or the ground to form a power supply conductor film 105a. The multilayer wiring portion 103 having the mesh-like power supply conductor film 105a is provided with conductor columns 108 insulated from the power supply conductor film 105a but passed through the power supply conductor film 105a. The conductor columns 108 include power supply conductor columns 108a connected to a power supply whose potential is different from that of the power supply conductor film 105a or the ground and signal conductor columns 108b for receiving and supplying signals.

However, no consideration has heretofore been imparted to the insulation space between the mesh-like conductor film 105a and the conductor column 108a and this has result in making the insulation space between the power supply conductor film 105a and the power supply conductor column 108a equal to the insulation space between the power supply conductor film 105a and the signal conductor column 108b.

In case a short-circuit occurs during the process of manufacturing the multilayer wiring portion 103 due to the fact that the insulation space between the power supply conductor film 105a and the signal conductor column 108b cannot be held, repair is possible as it is relative easy to specify the shorted point through an electrical test. Notwithstanding, in case of a short-circuit occurs during the process of manufacturing the multilayer wiring portion 103 due to the fact that the insulation space between the power supply conductor film 105a and the power supply conductor column 108a cannot be held, it is still extremely difficult to specify a shorted point through such an electrical test as infinitely many points that may cause a short-circuit exist in a substrate. The multilayer wiring portion 103 becomes unusable because the shorted point is left unrepaired.

Since the multilayer wiring portion 103 using the insulating film 106 of polyimide, for instance, having a low dielectric constant is employed for high-speed operations, its density has been rendered extremely high. As the insulation space between the mesh-like conductor film 105a and the conductor columns 108a and 108b is very small, a probability of short-circuit occurrence is also high. For this reason, the problem is that the conventional multilayer wiring portion 103 exhibits a high percentage of defectives that are difficult to remedy.

SUMMARY OF THE INVENTION

In view of the foregoing problems, an object of the present invention is to provide an integrated circuit package designed to lower not only a probability of short-circuit occurrence in a power supply conductor film across a power supply conductor column but also the possibility of generating a multilayer wiring portion difficult to repair.

The following technical means have been employed for an integrated circuit package according to the present invention.

The integrated circuit package has a multilayer wiring portion having a plurality of laminated wiring layers including insulating films having a low dielectric constant and conductor films. At least one mesh-like conductor film is furnished and connected to a power supply or the ground to form a power supply conductor film. There are provided conductor columns insulated from the power supply conductor film but passed through the power supply conductor film, at least one of the conductor columns being connected to a power supply whose potential is different from that of the power supply conductor film or the ground to form a power supply conductor column. The space between the power supply conductor film and the power supply conductor column is set greater than the space between other conductor columns different from the power supply conductor film and the power supply conductor column.

The space between the power supply conductor film and the signal conductor column is set greater than the space between other conductor columns different from the power supply conductor film and the power supply conductor column, whereby a probability of short-circuit occurrence in the power supply conductor film across the power supply conductor column is made lower than a probability of short-circuit occurrence in other conductor columns different from the power supply conductor film and the power supply conductor column.

As a result, the present invention has the effect of reducing a percentage of generation of a multilayer wiring portion which makes it difficult to specify a shorted point and which is difficult to repair.

DESCRIPTION OF THE PREFERRED EMBODIMENTS

Referring to the accompanying drawing, an integrated circuit package embodying the present invention will subsequently be described.

Figure 1:
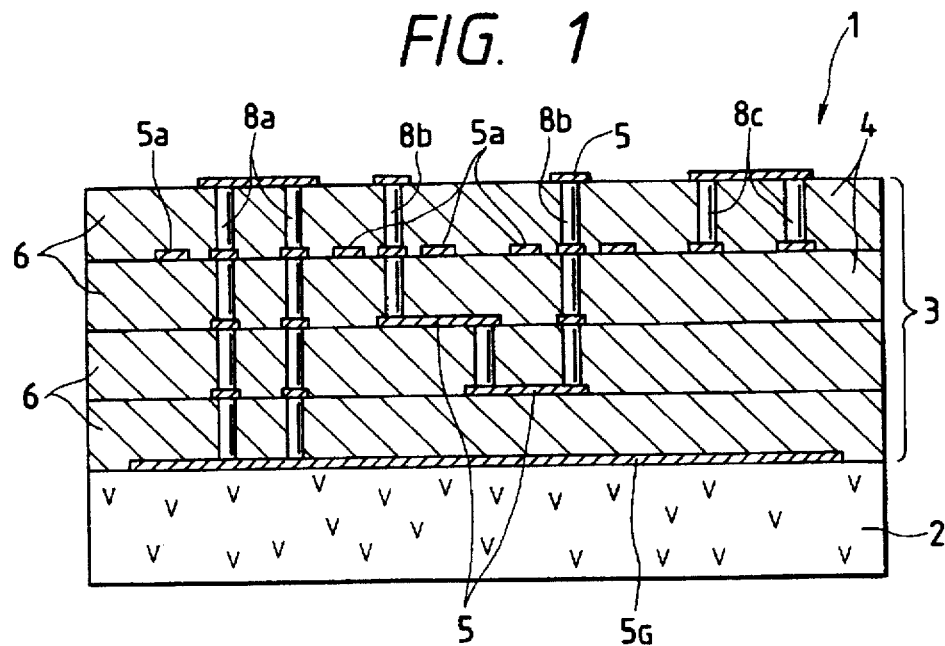
FIG. 1 is a sectional view of an integrated circuit package of the present invention.
Figure 2:
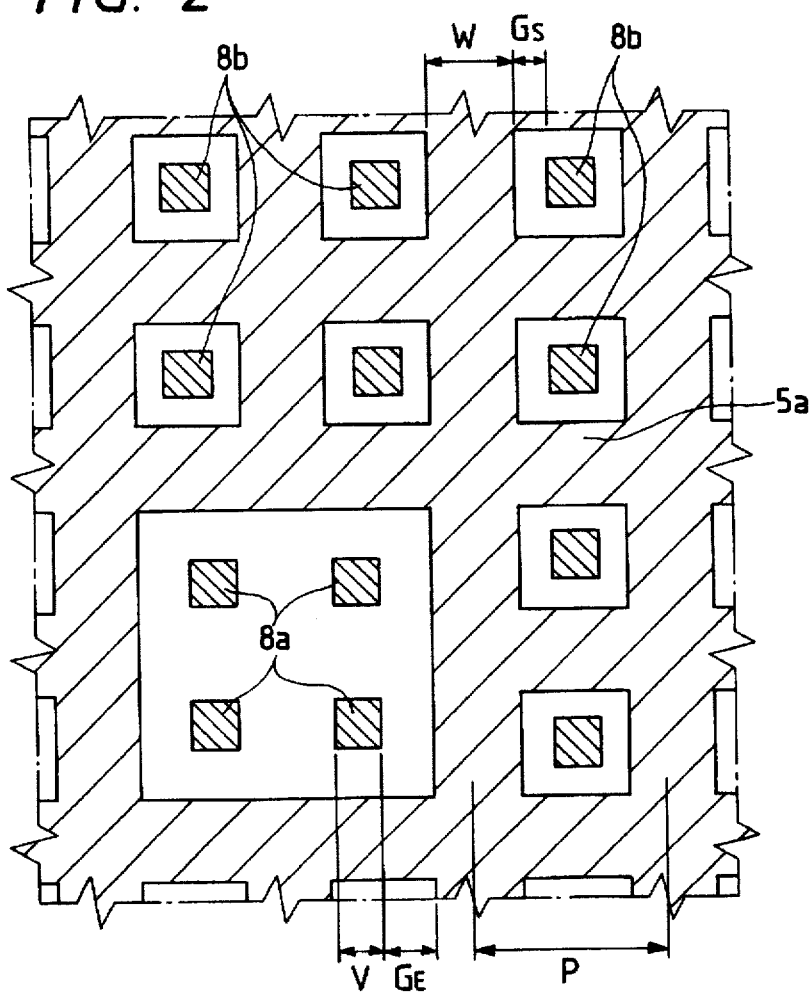
FIG. 2 is a sectional view of the principal part of a multilayer wiring portion of the embodiment.
Figure 3:
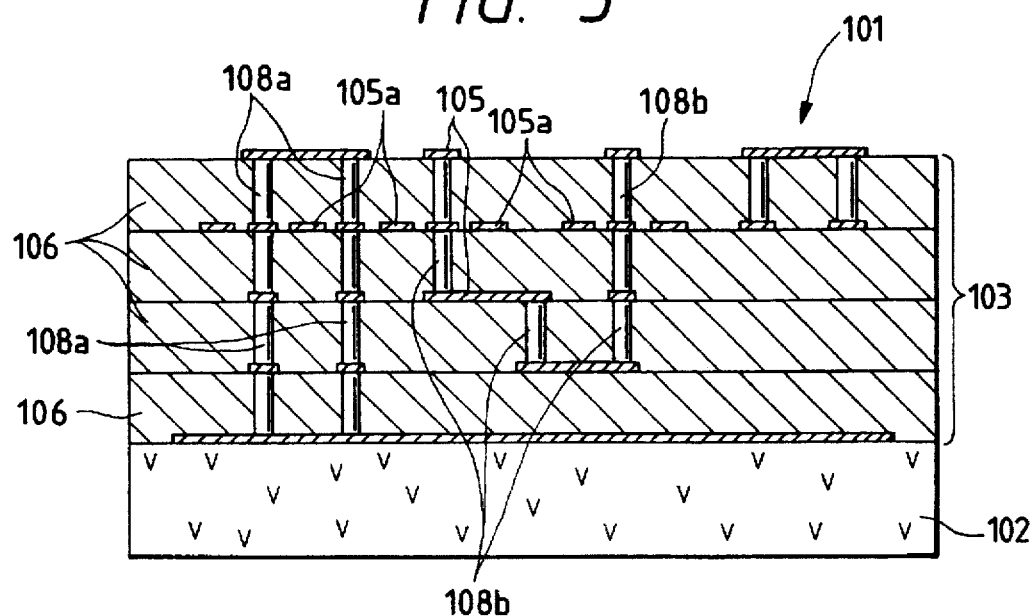
FIG. 3 is a sectional view of a conventional integrated circuit package.

FIGS. 1 and 2 illustrate an embodiment of the present invention: FIG. 1 is a sectional view of an integrated circuit package; FIG. 2 is a sectional view of the principal part of a multilayer wiring portion.

An integrated circuit package 1 is provided with an insulating substrate 2 and a multilayer wiring portion 3 formed on the surface of the insulating substrate 2, integrated circuits (not shown) being mounted on the surface of the multilayer wiring portion 3.

The insulating substrate 2 is a ceramic substrate made of insulating material such as alumina and aluminum nitride; more specifically, a green sheet mainly prepared from alumina is pressed into a predetermined shape and subsequently calcined at high temperatures in a moistening atmosphere of a hydrogen furnace. The insulating substrate 2 may be provided as a multilayer wiring substrate or a resin material.

The multilayer wiring portion 3 is formed of a plurality of laminated wiring layers 6 including insulating films 4 formed of insulating material (e.g., polyimide resin) having a low dielectric constant and conductor films 5. The multilayer wiring portion 3 is provided with mesh-like conductor films 5a formed in an intermediate wiring layer 6, which is a power supply conductor film connected to the power supply.

In the multilayer wiring portion 3, there are provided conductor columns 8a and 8b insulated from and passed through the power supply conductor film 5a and conductor columns 8c connected to the power supply conductor film 5a. Of the conductor columns 8a and 8b insulated and passed through power supply conductor film 5a, the conductor film $5_G$ (ground) formed on the surface of the insulating substrate is used as a power supply conductor whose potential is different from that of the power supply conductor film 5a. Moreover, the conductor column whose potential is different from the power supply conductor column 8a is a signal conductor column and used to exchange signals with the integrated circuit.

The insulation space GE (e.g., 40–50 μm) between the power supply conductor film 5a and the power supply conductor column 8a is, as shown in FIG. 2, set greater than the insulation space $G_S$ (e.g., 30–35 μm) between the power supply conductor film 5a and the signal conductor column 8b. In this embodiment, the power supply conductor film 5a on the periphery of the power supply conductor column 8a is cut out to make greater the insulation space $G_E$ between the power supply conductor film 5a and the power supply conductor column 8a than the insulation space $G_S$ between the power supply conductor film 5a and the signal conductor column 8b.

Next, a method of manufacturing the multilayer wiring portion 3 will be briefly described.

First, the conductor film 5 (ground layer $5_G$) is formed on the insulating substrate 2. For the purpose, a conductive base film (e.g., a double-layer thin film resulting from the formation of a thin Cu film on the surface of a thin Cr film) as a base for electrolytic plating is formed by sputtering. Photoresist is applied onto the base film, which is exposed to pattern and then only the photoresist is removed by developing from a portion where a ground layer is formed. Subsequently, the ground layer of Cu or Cu—Ni is formed by electrolytic plating in the portion where the photoresist is removed.

Photoresist is then applied in order to form a via hole with one side 20–200 μm long where the conductor column 8 is formed through exposure and development processes. Subsequently, the conductor column 8 of Cu is formed in the via hole. After the photoresist is removed, the needless base film is removed by etching. The conductor column 8 connected to the ground layer is thus formed through the steps set forth above. Polyimide resin is then applied in such a way as to cover the conductor column 8 and hardened. The surface of the hardened polyimide resin is polished to expose the head of the conductor column 8. The insulating film 4, 5–50 μm thick, is formed at this step. The first wiring layer 6 is first formed through these steps.

Then the process of forming the base film by sputtering on the surface of the first insulating film 4 is repeated to stack the second and third wiring layers 6 sequentially, so that the multilayer wiring portion 3 is formed.

Various integrated circuit packages were subsequently prepared to make certain of a percentage of short-circuits occurring in the power supply conductor film 5a across the power supply conductor column 8a. While the insulation space between the power supply conductor film 5a and the power supply conductor column 8a in the multilayer wiring portion 3 of the integrated circuit package 1 used for testing was varied, a percentage of short-circuits occurring in the power supply conductor film 5a across the power supply conductor column 8a with all the conductor columns 8 formed as the power supply conductor columns 8a was confirmed. In this case, the insulating substrate 2 was a square 3 mm thick with one side 100 mm long. Moreover, the multilayer wiring portion 3 was formed by stacking four layers of insulating film 4 and five layers of conductor film 5, 25 μm thick into a square with one side 100 mm long as in the case of the insulating substrate 2. The multilayer wiring portion 3 was divided into 9 blocks, each being provided with 5,474 (74×74) conductor columns 8 (power supply conductor columns 8a), in order to examine the presence of a short-circuit in all the power supply conductor columns 8a in each block. Table 1 shows test results.

TABLE 1

|  | Ex. 1 | Ex. 2 | Ex. 3 | Ex. 4 |
| --- | --- | --- | --- | --- |
| Mesh pitch P (μm) | 200 | 200 | 200 | 200 |
| Mesh width W (μm) | 90 | 80 | 70 | 50 |
| Conductor column width V (μm) | 50 | 50 | 50 | 50 |
| Insulation space G (μm) | 30 | 35 | 40 | 50 |
| Percentage of short-circuits | 9/9 | 7/9 | 3/9 | 0/9 |

Figure 4:
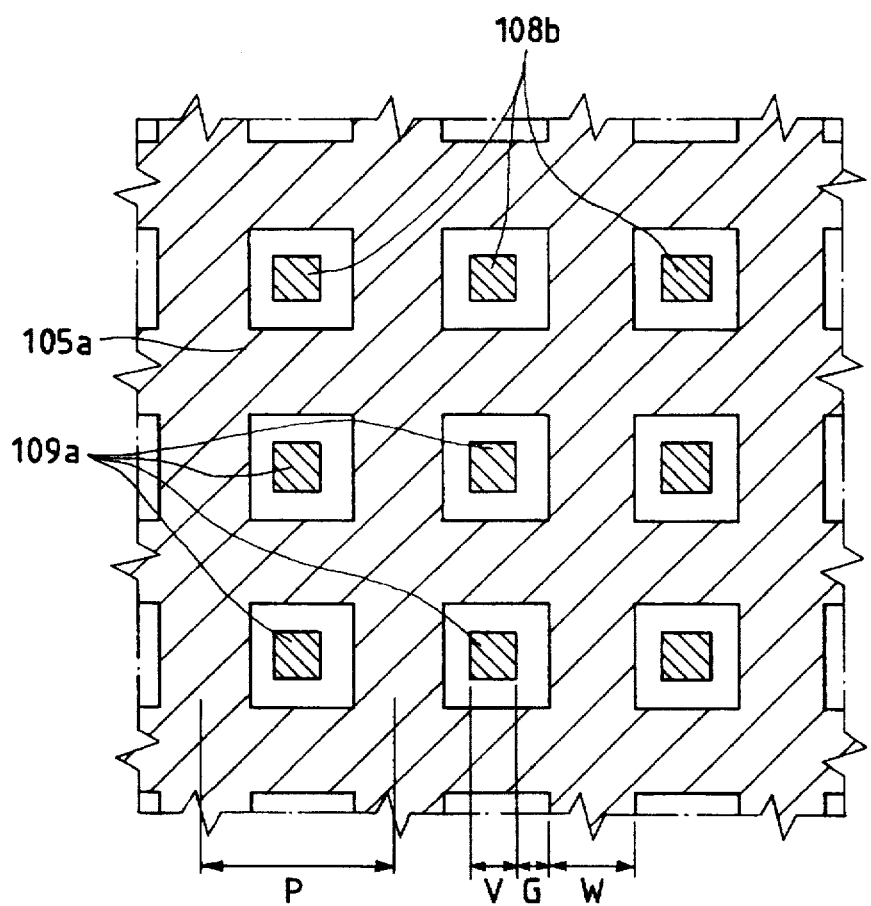
FIG. 4 is a sectional view of the principal part of a conventional multilayer wiring portion.

P shown in Table 1 represents the mesh pitch of the power supply conductor film, W the mesh width of the power supply conductor film, V the length of one side of the square conductor column, and G the insulation space between the power supply conductor film and the power supply conductor column (see FIG. 4).

As obvious from the test results of Table 1, the power supply conductor film 5a on the periphery of the power supply conductor column 8a is cut out to make the space between the power supply conductor film 5a and the power supply conductor column 8a over 40 μm in this embodiment, so that a probability of short-circuit occurrence in the power supply conductor film 5a across the power supply conductor column 8a is lowered. Particularly by making the space between the power supply conductor film 5a and the power supply conductor column 8a over 50 μm, a probability of short-circuit occurrence in the power supply conductor film 5a across the power supply conductor column 8b can be reduced to nil.

As set forth above, the present invention has the effect of reducing a percentage of generation of the multilayer wiring portion which makes it difficult to specify a shorted spot and which is difficult to repair by setting the space between the power supply conductor film 5a and the power supply conductor column 8a over 40 μm and of improving the reliability of the integrated circuit package 1.

What is claimed is:

1. An integrated circuit package comprising:

a multilayer wiring portion in which a plurality of wiring layers are stacked, said wiring layers including insulating films having a low dielectric constant and conductor films, at least one mesh-like conductor film being provided and connected to one of a power supply and ground to form a power supply conductor film; and a plurality of conductor columns insulated from said power supply conductor film but passed through said power supply conductor film, at least one of the conductor columns being connected to one of a power supply having a potential different from that of said power supply conductor film and ground to form a power supply conductor column;

wherein an insulating space between said power supply conductor film and maid power supply conductor column is greater than an insulating space between other conductor columns different from said power supply conductor column and said power supply conductor film.

2. An integrated circuit package as claimed in claim 1, wherein on said multilayer wiring portion, integrated circuits are mounted, and said other conductor columns are signal conductor columns for exchanging signals with said integrated circuits.

3. An integrated circuit package as claimed in claim 1, wherein said power supply conductor film is cut along a periphery of said power supply conductor column.

* * * * *